Figure 1:
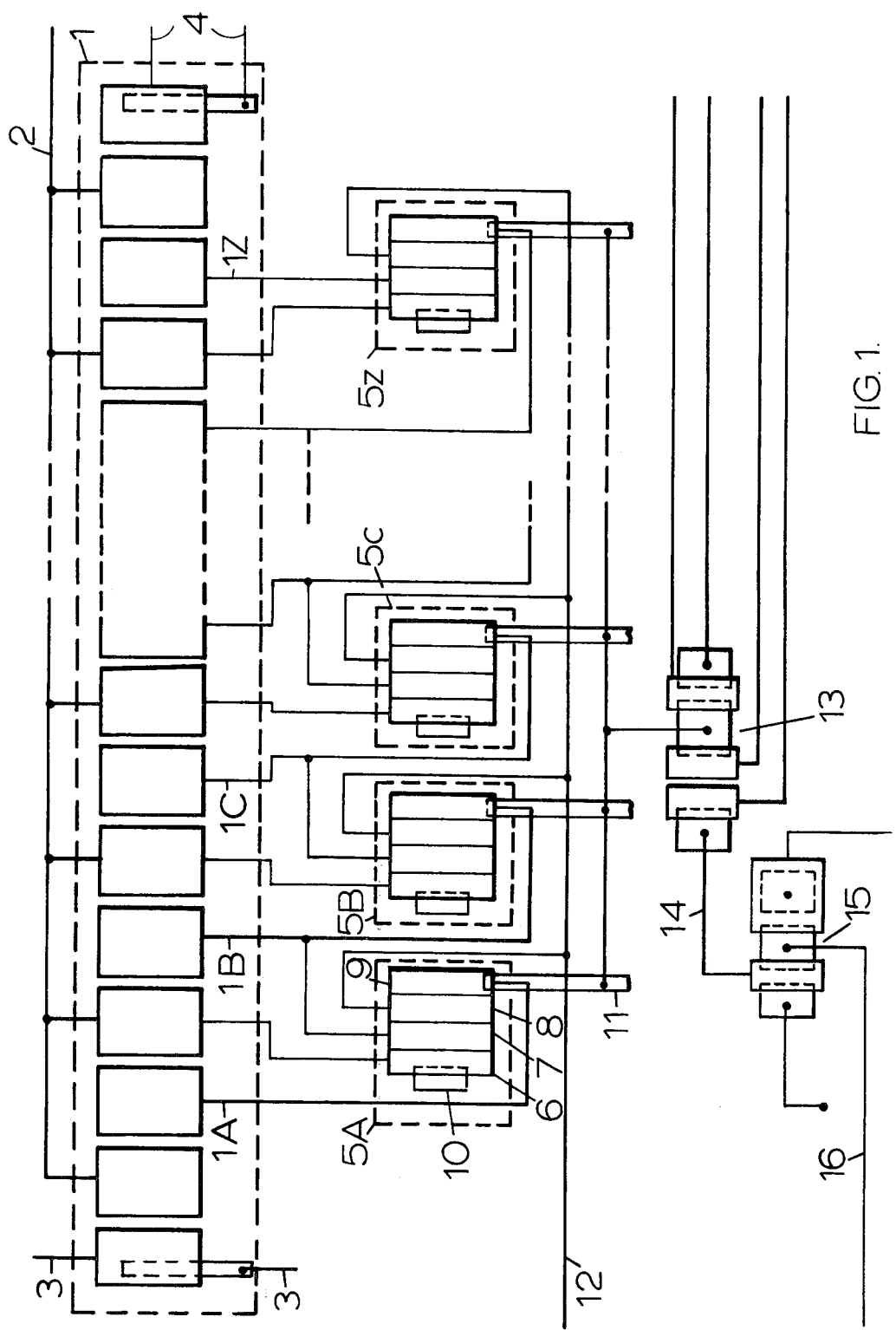

United States Patent [19]

Haken et al.

[11] 4,125,818
[45] Nov. 14, 1978

[54] CHARGE-COUPLED DEVICES

[75] Inventors: Roger A. Haken, South Croydon; Peter C. T. Roberts, Totton; Robert G. Taylor, Portsmouth; Christopher P. Traynar, Kettering, all of England

[73] Assignee: National Research Development Corporation, London, England

[21] Appl. No.: 742,182

[22] Filed: Nov. 16, 1976

[30] Foreign Application Priority Data

Nov. 17, 1975 [GB] United Kingdom ............... 47349/75

[51] Int. Cl.² ......................... H03H 7/28; H03H 7/30; H01L 29/90; H01L 29/78
[52] U.S. Cl. .............................. 333/70 T; 307/221 D; 307/293; 333/29; 357/13; 357/24
[58] Field of Search ........................ 357/13, 24, 23, 41; 307/221 R, 221 D, 304, 293; 333/70 T, 29; 328/167

[56] References Cited

U.S. PATENT DOCUMENTS

| | | | |
|---|---|---|---|
| 3,546,490 | 12/1970 | Sangster | 307/293 |
| 3,676,711 | 7/1972 | Ahrons | 357/24 X |
| 3,946,247 | 3/1976 | Collins et al. | 357/41 X |
| 4,037,119 | 7/1977 | Schat | 307/221 D X |

Primary Examiner—Alfred E. Smith
Assistant Examiner—Marvin Nussbaum
Attorney, Agent, or Firm—Cushman, Darby & Cushman

[57] ABSTRACT

A charge-coupled analogue delay line has a plurality of analogue storage locations, and a gating means, which may include charge-coupled shift register, for enabling input to and output from each of the storage locations in turn. The storage locations are formed on a semiconducting substrate and each has a diffused zener diode to act as a source of minority carriers and a priming electrode for drawing off and holding a charge of minority carriers from the zener diode. A sample-holding electrode, upon receipt of a gating signal by a gating electrode, receives from the priming electrode and holds a charge of minority carriers of magnitude indicative of the magnitude of the signal to be stored. An output electrode is arranged to transfer the charge held by the sample-holding electrode to a diffused output channel. Since signal samples in this delay line are transferred just once into a storage location and then out again they suffer less from degradation due to residual charges then is the case in conventional CCD delay lines in which samples are passed from location to location.

3 Claims, 5 Drawing Figures

CHARGE-COUPLED DEVICES

The present invention relates to charge-coupled devices (CCDs), and in particular to CCD clocked delay lines.

A problem which arises in CCD clocked delay lines, and especially those having a large number of storage locations, is that of residual charges. When a signal sample is shifted from one location to another in a CCD delay line a small amount of charge is left behind and remains to corrupt the next signal sample to pass the same way. In small delay lines, having only a small number of locations, the effect of residual charges is small, but in some applications, an example of which will be given later, it is required to have a large number of locations. A sample entering the delay line will thus undergo a large number of transfers, being slightly corrupted at each transfer by the residual charge from the previous sample, before it is output from the delay line, and if the number of locations is large enough the sample may be corrupted to an unacceptable degree in passing through the delay line.

It is an object of the present invention to provide a CCD delay line in which the number of transfers undergone by a signal sample is reduced compared with conventional CCD delay lines with a comparable number of locations.

According to the present invention there is provided a charge-coupled delay line comprising:
a signal input connection,
a signal output connection,
a plurality of analogue storage locations,
and gating means for enabling output from each of the locations in turn in a predetermined order to the signal output and enabling input to each of the locations in turn in the same predetermined order from the signal input.

The gating means may be arranged to apply an output-enabling signal to each storage location simultaneously with an input-enabling signal to the immediately preceding storage location in the predetermined order.

The gating means may include a charge-coupled shift register, having tappings for providing input-enabling and output-enabling signals for the storage locations.

Each storage location may be a charge-coupled device formed on a doped semi-conducting substrate and including a stepped priming electrode, a Zener diode formed in the sub-strate and arranged to inject minority carriers into the substrate under the priming electrode, a stepped sample-holding electrode, a gate electrode between and adjacent to a charge-output edge of the priming electrode and a charge-input edge of the sample-holding electrode, an output electrode having a charge-input edge adjacent to a charge-output edge of the sample holding electrode, and an output channel formed in the substrate and extending under the output electrode for capturing minority-carrier charges. The output channels of the storage location may be connected to the signal output connection via a common sample-and-hold circuit. Clearing means may also be provided for resetting the output channels to a fixed reset voltage.

The delay line may be used in a radar clutter integrator for reducing the amount of noise due to uncorrelated reflections by averaging the signals corresponding to each bearing and range over several successive scans.

Figure 2:
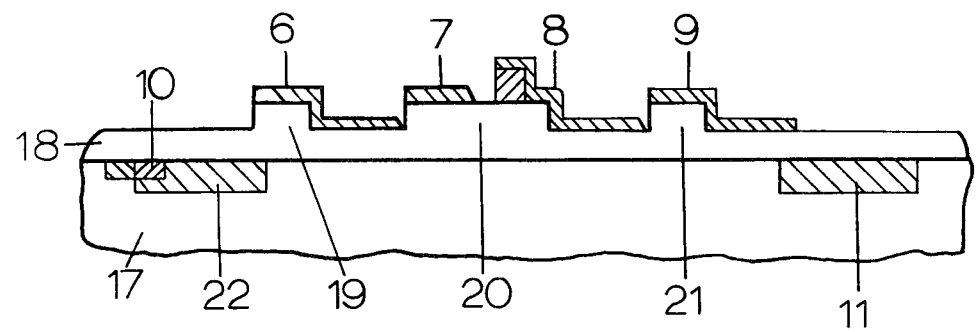
Figure 3:
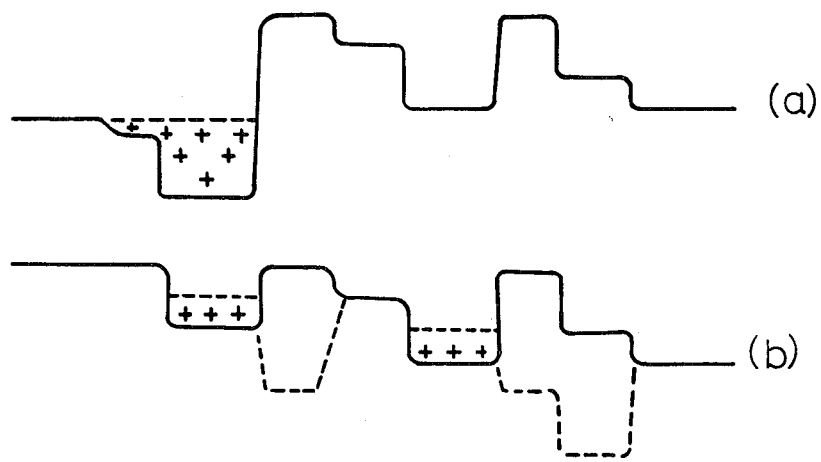
Figure 4:
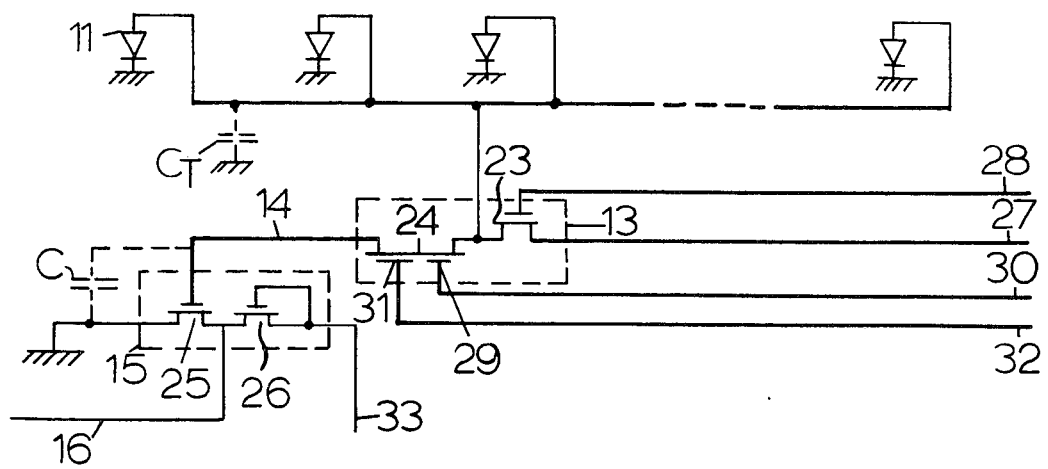
Figure 5:
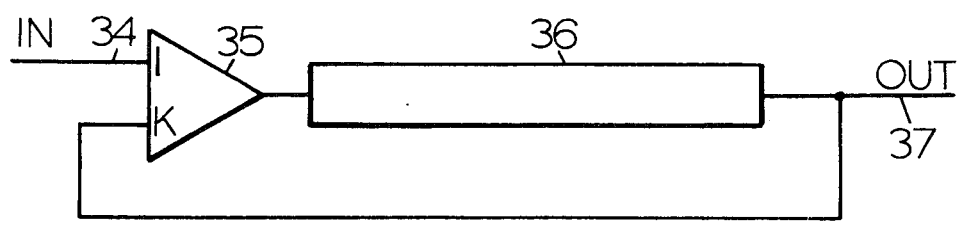

An embodiment of the invention will now be described by way of example with reference to the accompanying drawings of which, FIG. 1 shows diagrammatically a form of delay line according to the invention capable of implementation as a single integrated circuit, FIG. 2 shows in section a storage location used in the delay line of FIG. 1, FIG. 3 is a diagram illustrating the mode of operation of the storage location of FIG. 2, FIG. 4 is a circuit diagram illustrating the output arrangement of the delay line of FIG. 1, and FIG. 5 illustrates an application of the delay line according to the invention as a radar clutter integrator.

In FIG. 1 is shown a charge-coupled shift register 1, having a clocking input 2 serial signal input 3, serial signal output 4, and tappings 1A, 1B, 1C, to 1Z. Associated with each of the tappings 1A to 1Z there is a storage location 5A, 5B, 5C, to 5Z.

Each storage location, for example, 5A, is a metal-oxide-semi-conductor charge-coupled device comprising a priming electrode 6, a gate electrode 7, a sample-holding electrode 8, and an output electrode 9, arranged successively adjacent to one another in the order given, a Zener diode 10, extending under the priming electrode 6, and an output channel 11, extending under the output electrode 9. Each of the tappings 1A to 1Z of the shift register 1 is connected to the output electrode 9 of its corresponding storage location, and to the gate electrode 7 of the preceding sotrage location. Thus the tapping 1A is connected to the output electrode 9 of storage location 5A, tapping 1B is connected to the output electrode of storage location 5B and the gate electrode 7 of location 5A, tapping 1C is connected to the output electrode of location 5C and the gate electrode of location 5B and so on. The clocking input 2 is connected to the priming electrodes of each of the storage locations 5A to 5Z and a signal input connection 12 is connected to all of the sample-holding electrodes of the storage locations 5A to 5Z.

The output channels 11 of the storage locations 5A to 5Z are connected to a common combined sample-and-hold circuit and clearing circuit 13 the output 14 of which is connected via an inverting amplifier 15 to a signal output connection 16.

FIG. 2 shows in section one of the storage locations of the delay line of FIG. 1. The storage location is formed, as is the whole of the delay line shown in FIG. 1, on a slice 17 of n-type silicon bearing an oxide layer 18. The electrodes 6, 7, 8 and 9 are formed on the oxide layer 18 and are arranged adjacent end to end. The oxide layer 18 is of generally uniform thickness, but is thicker at patches 19, 20 and 21. The priming electrode 6 is formed partly on the thicker patch 19 and extends close to the edge of the thicker patch 20. The gate electrode 7 is formed on the thicker patch 20 and the sample-holding electrode 8 is formed partly on the thicker patch 20 and extends close to the edge of the thicker patch 21. The output electrode 9 is formed partly on the thicker patch 21 and extends away from it for some distance. In the case of the priming electrode 6, the sample holding electrode 8 and the output electrode 9, all of which are formed partly on a thicker patch of the oxide layer 18 and partly on the thinner, generally uniform part, the edge of that part of the electrode which is on the thicker patch is an input edge and the edge which is on the generally uniform thinner part is an output edge.

A Zener diode 10 is formed by diffusion in the substrate 17 and is connected by a p-type diffused channel 22 to a part of the substrate below the input edge of the priming electrode 6. Similarly a diffused p-type output channel 11 extends into a part of the substrate beneath the output edge of the output electrode 9.

The operation of the storage location of FIG. 2 is illustrated in FIG. 3 which shows the variation of electrical potential at the interface between the substrate 17 and the oxide layer 18 along the length of the storage location of FIG. 2. FIG. 3a shows the potential when a priming charge is introduced beneath the priming electrode 6. A negative voltage is applied to the priming electrode 6 causing the Zener diode 10 to break down and to inject minority carriers (holes) via the channel 22 into the substrate under the priming electrode 6. There is thus a charge held under the priming electrode 6 which cannot proceed further towards the sample-holding electrode 8 because of the higher potential under the gate electrode 7.

FIG. 3b shows the potential when a charge has been transferred from under the priming electrode 6 to the sample holding electrode 8. The voltage on the priming electrode 6 has been raised and at the same time the voltage on the gate electrode 7 has temporarily been lowered to the value indicated by a dotted line. Some charge has thus been transferred from under the priming electrode 6 to the sample-holding electrode 8. The amount of charge which has been so transferred depends linearly on the voltage of the sample holding electrode 8. Of the charge which is not so transferred some remains under the priming electrode 6 and some has been spilled back into the substrate via the channel 22 and the Zener diode 10. There is thus a charge trapped under the sample-holding electrode 8 whose magnitude represents the voltage of the sample-holding electrode 8 at the time when the voltage of the priming electrode 6 was raised and the voltage of the gate electrode 7 was lowered. The charge trapped under the sample-holding electrode 8 thus represents the signal sample which is held in the storage location. When the voltage of the output electrode 9 is lowered as shown by the dotted line in FIG. 3b the charge held under the sampling-holding electrode 8 is transferred to the output electrode 9, and when the voltage is raised again it is transferred to the output channel 11.

FIG. 4 shows, in circuit diagram form, the output arrangement of the delay line shown in FIG. 1. The combined sample and hold and reset circuit 13 comprises two metal-oxide-semi-conductor (MOS) transistors 23 and 24, and the inverting amplifier 15 comprises two MOS transistors 25 and 26. The MOS transistors 23, 24, 25 and 26 are all p-channel transistors and are formed by diffusion in the integrated circuit in the conventional way. The output channels 11 of the storage locations, being p-type channels in an n-type substrate, are shown in FIG. 4 as diodes and are connected via MOS transistor 23 to a connection 27 which, in use, has a negative reset voltage applied to it. The gate of the MOS transistor 23 is connected to a reset connection 28. When the MOS transistor 23 is turned on by the application of a negative voltage to the reset connection 28 the output channels 11 are connected to the connection 27, and are thus reset to the applied reset voltage. The voltage of the output channel 11 is maintained, when the MOS transistor 23 is switched off, by charges stored in them. The capacitance to ground $C_T$ of the output channels 11 is shown in FIG. 4 by a capacitance drawn in dotted lines.

The output channels 11 are also connected to the inverting amplifier 15 via MOS transistor 24. The MOS transistor 24 has two gates: a first gate 29, which is connected to a sample trigger input 30, and a second gate 31 which is connected to a constant voltage input connection 32. In use a constant negative voltage is applied through the constant voltage input connection 32 to the second gate 31, so that the MOS transistor 24 is switched on whenever a negative voltage is applied via the sample trigger input 30 to the first gate 29. The purpose of the second gate 31 is to prevent capacitive coupling between the sample trigger input 30 and the output 14 of the sample and hold circuit 13. The output 14 of the sample and hold circuit 13 has a capacitance to ground C, and when the transistor 24 is switched on a small amount of charge flows from the capacitance $C_T$ into the capacitance C, charging it up to a voltage representative of the last sample to be output from one of the storage locations 5A to 5Z of FIG. 1. It is arranged that the capacitance to ground C of the output 14 is much less than the capacitance to ground $C_T$ of the output channels 11, so that the amount of charge which is transferred is small. The output 14 of the sample and hold circuit 13 is connected to a gate of the MOS transistor 25 which is connected between the signal output connection 16 and the substrate. The signal output connection 16 is also connected via MOS transistor 26 to a constant voltage input connection 33 which is also connected to the gate of the MOS transistor 26. The signal output connection 16 thus carries a voltage which is representative of the last signal sample to be sampled.

FIG. 5 illustrates a possible application of a delay line according to the present invention. Radar apparatus (not shown) produces an analogue signal which is representative of the amplitude of the reflected radar signal. The analogue signal is sampled at successive time intervals to produce a series of analogue signal samples which are representative of the amplitude of reflection from successive ranges and bearings. The signal samples are fed to a first input 34 of an adder circuit 35 and thence to an analogus delay line 36. The output 37 of the analogue delay line 36 is connected to a second input 38 of the adder circuit 35. The number of locations in the delay line 36 is equal to the number of ranges and bearings covered by the radar apparatus. The signal samples stored in the delay line 36 are weighted averages over successive scans of the analogue signals produced by the radar apparatus for the various ranges and bearings. When the radar apparatus produces a new analogue signal corresponding to a particular bearing and range, the old average signal, stored in the delay line 36 is multiplied by a factor K (K<1) and added to the new analogue signal produced by the radar apparatus in the adding circuit 35, thus forming a new average which is stored in the delay line 36.

In order to be able to store enough bearings and ranges to construct a satisfactory picture, the number of locations in the delay line 36 must be very large, and in order to accommodate an adequate scanning frequency the clocking rate must be high. Residual charge problems in the delay line 36 are thus likely to be very serious using conventional delay lines, so a delay line according to the present invention could be used to considerable advantage.

Delay lines according to the present invention are not restricted to the application which has been described above, but may be used to advantage in a variety of applications where a clocked analogue delay line with a large capacity is required. For example a delay line according to the invention could be used to store a complete frame of a television picture.

We claim:

1. A charge-coupled delay line comprising:

a signal input line;

a signal output line;

a plurality of analogue storage locations connected in parallel to said input and output lines, and gating means for enabling output from each of said locations in turn in a predetermined sequence to said signal output line and for enabling input to each of said locations in turn in said predetermined sequence from said signal input line, wherein each of said storage locations is a charge-coupled device formed on a doped semi-conducting substrate and including:

a stepped priming electrode;

a zener diode formed in said substrate and arranged to inject minority carriers into said substrate under said priming electrode;

a stepped sample-holding electrode;

a gate electrode between and adjacent to a charge-output edge of said priming electrode and a charge-input edge of said sample-holding electrode;

an output electrode having a charge-input edge adjacent to a charge-output edge of said sample-holding electrode; and an output channel formed in the said substrate and extending under said output electrode for capturing minority-carrier charges.

2. The delay line of claim 1, wherein said output channels of said storage locations are connected to said signal-output connection via a common sample-and-hold circuit.

3. The delay line of claim 1, including clearing means for re-setting said output channels of said storage location to a fixed reset voltage.

* * * * *